United States Patent
Park et al.

(10) Patent No.: US 10,043,943 B2
(45) Date of Patent: Aug. 7, 2018

(54) UV LIGHT EMITTING DIODE HAVING A STRESS ADJUSTMENT LAYER

(71) Applicant: SEOUL VIOSYS CO., LTD., Ansan-si (KR)

(72) Inventors: Ki Yon Park, Ansan-si (KR); Jeong Hun Heo, Ansan-si (KR); Yu Dae Han, Ansan-si (KR); Gun Woo Han, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/563,538

(22) PCT Filed: Mar. 29, 2016

(86) PCT No.: PCT/KR2016/003216
§ 371 (c)(1),
(2) Date: Sep. 29, 2017

(87) PCT Pub. No.: WO2016/159638
PCT Pub. Date: Oct. 6, 2016

(65) Prior Publication Data
US 2018/0090641 A1    Mar. 29, 2018

(30) Foreign Application Priority Data

Mar. 31, 2015  (KR) .................. 10-2015-0045551

(51) Int. Cl.
*H01L 33/12*   (2010.01)
*H01L 33/06*   (2010.01)
(Continued)

(52) U.S. Cl.
CPC ............ *H01L 33/12* (2013.01); *H01L 33/007* (2013.01); *H01L 33/0079* (2013.01);
(Continued)

(58) Field of Classification Search
CPC ....... H01L 33/00; H01L 33/007; H01L 33/06; H01L 33/12; H01L 33/22; H01L 33/32
See application file for complete search history.

(56) References Cited

U.S. PATENT DOCUMENTS

2016/0043183 A1*  2/2016  Harada .................. H01L 33/12
257/76

FOREIGN PATENT DOCUMENTS

| JP | 2014-068018 A | 4/2014 |
| JP | 5556657 B2 | 7/2014 |

(Continued)

OTHER PUBLICATIONS

International Search Report in International Application No. PCT/KR2016/003216, dated Jun. 27, 2016.

*Primary Examiner* — Hoai V Pham
(74) *Attorney, Agent, or Firm* — Perkins Coie LLP

(57) ABSTRACT

Disclosed herein is a UV light emitting diode. The UV light emitting diode includes a first conductive type semiconductor layer; a first stress adjustment layer disposed on the first conductive type semiconductor layer, and including a first nitride layer including Al and a second nitride layer disposed on the first nitride layer and having a lower Al composition ratio than the first nitride layer; an active layer disposed on the first stress adjustment layer; and a second conductive type semiconductor layer disposed on the active layer, wherein the first stress adjustment layer includes an Al delta layer inserted in the first nitride layer, and a lower surface of the first nitride layer in which the Al delta layer is inserted has greater average tensile stress than a lower surface of the second nitride layer directly disposed on the first nitride layer.

27 Claims, 6 Drawing Sheets

(51) Int. Cl.
*H01L 33/22* (2010.01)
*H01L 33/00* (2010.01)
*H01L 33/38* (2010.01)
*H01L 33/32* (2010.01)

(52) U.S. Cl.
CPC .............. *H01L 33/06* (2013.01); *H01L 33/22* (2013.01); *H01L 33/32* (2013.01); *H01L 33/38* (2013.01)

(56) References Cited

FOREIGN PATENT DOCUMENTS

| KR | 10-2009-0070259 A | 7/2009 |
| KR | 10-2012-0011131 A | 2/2012 |
| KR | 10-2014-0099687 A | 8/2014 |

\* cited by examiner

[Fig. 1]
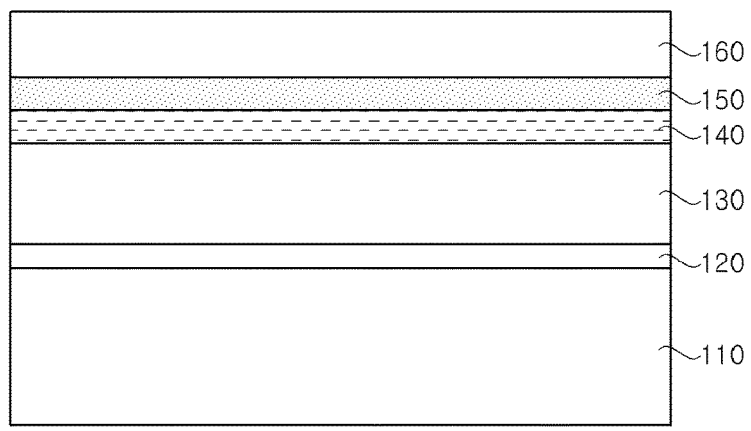
[Fig. 2]
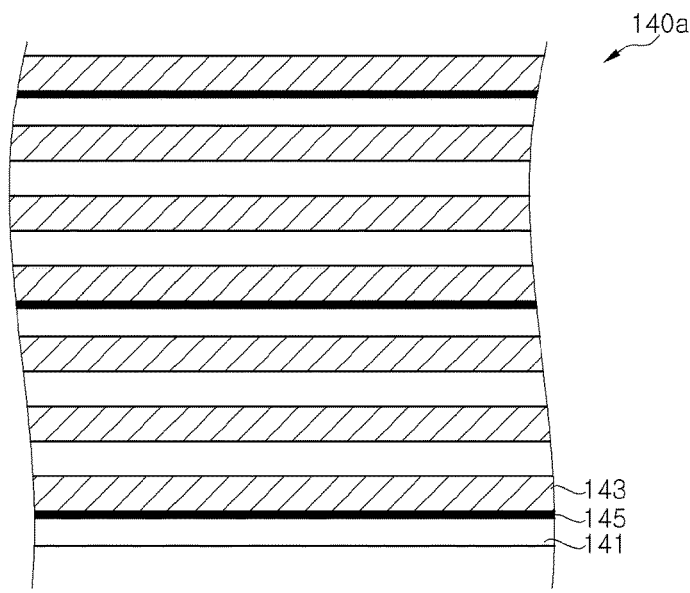
[Fig. 3a]
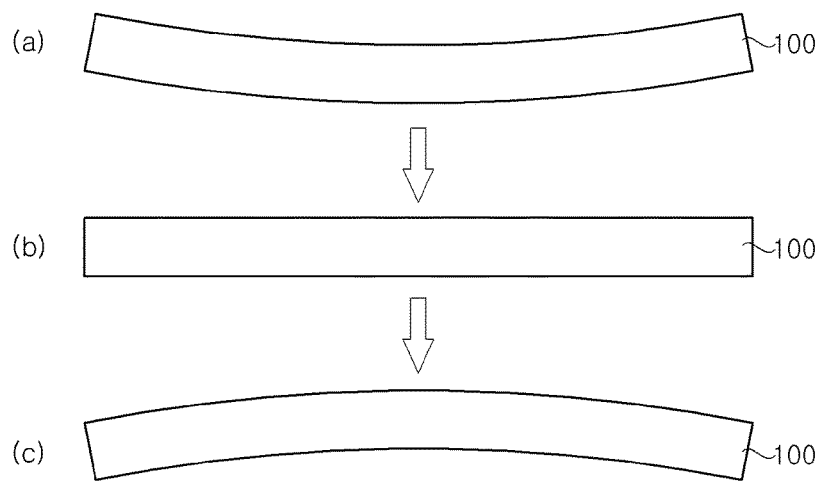

[Fig. 3b]
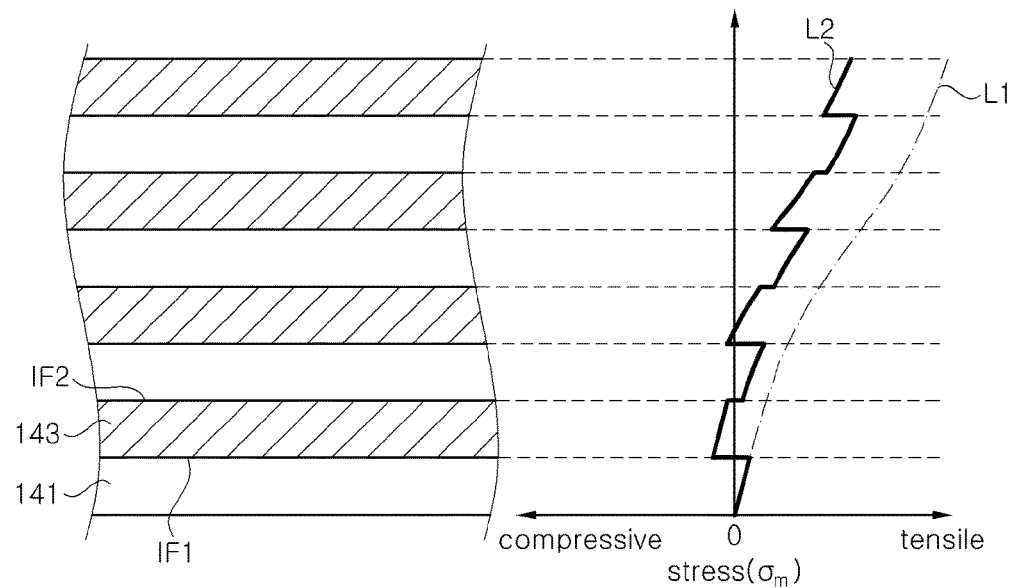
[Fig. 3c]
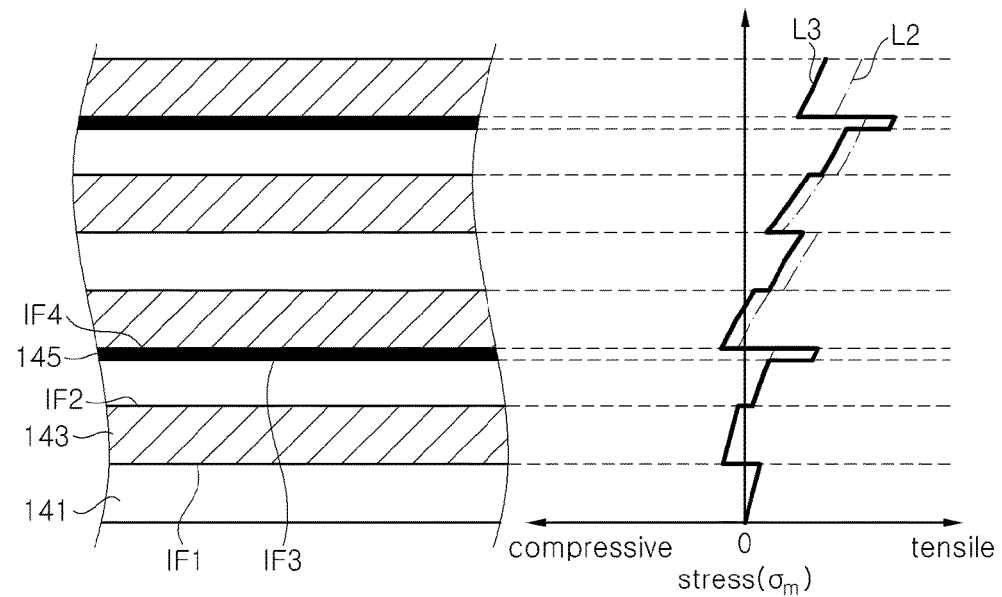

[Fig. 4]
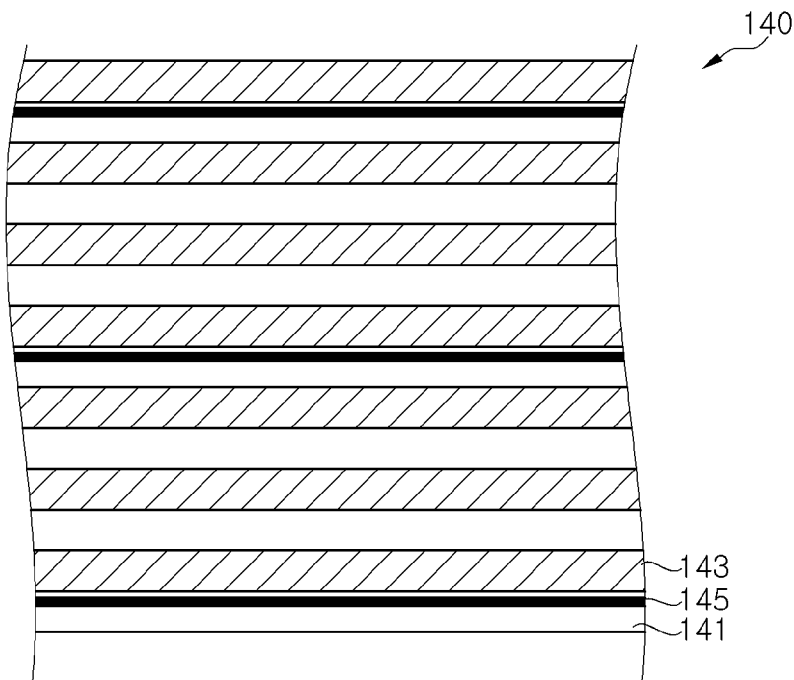
[Fig. 5]
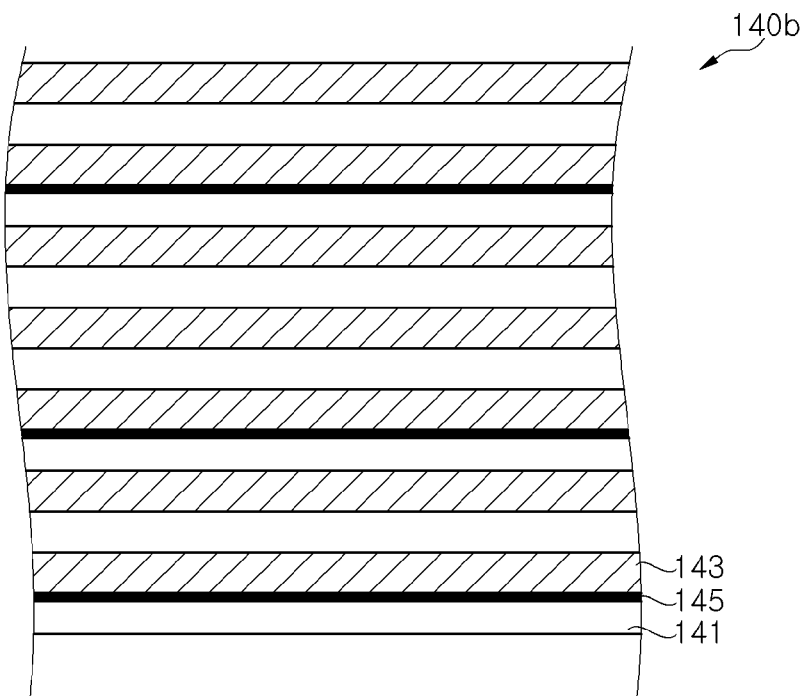

[Fig. 6]
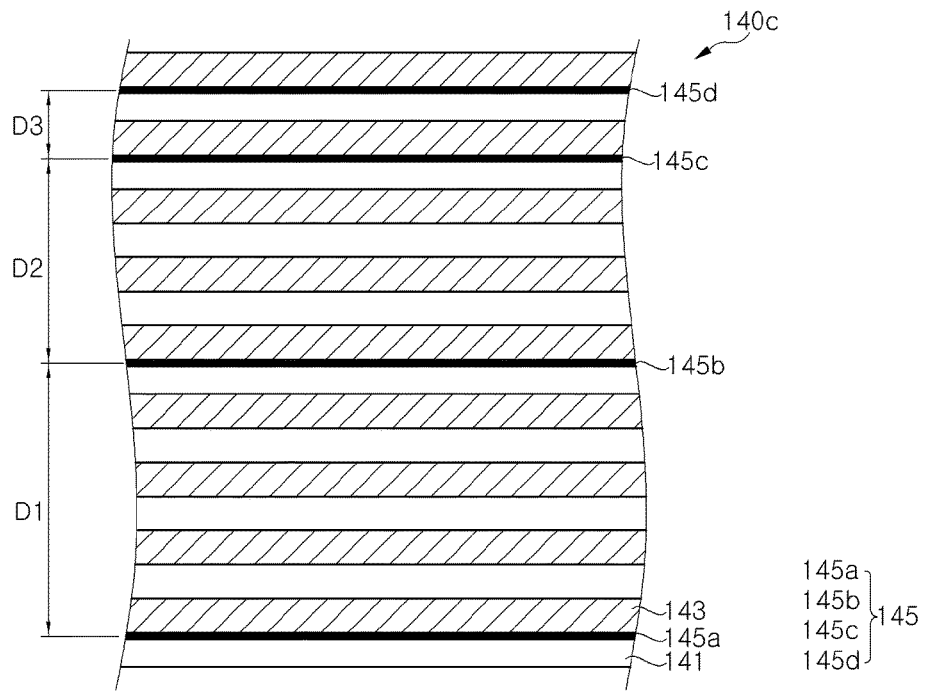
[Fig. 7a]
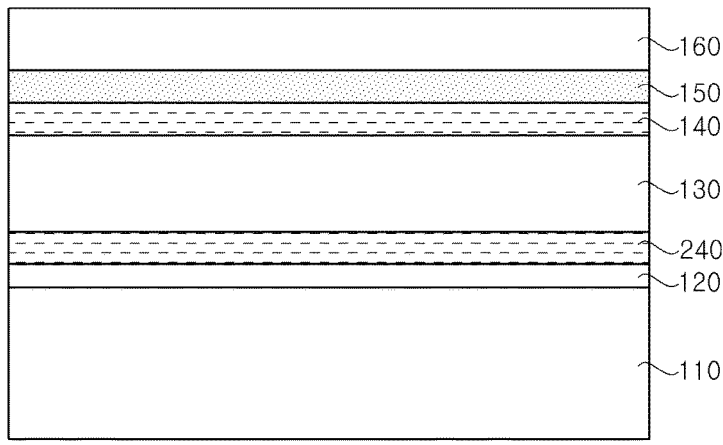
[Fig. 7b]
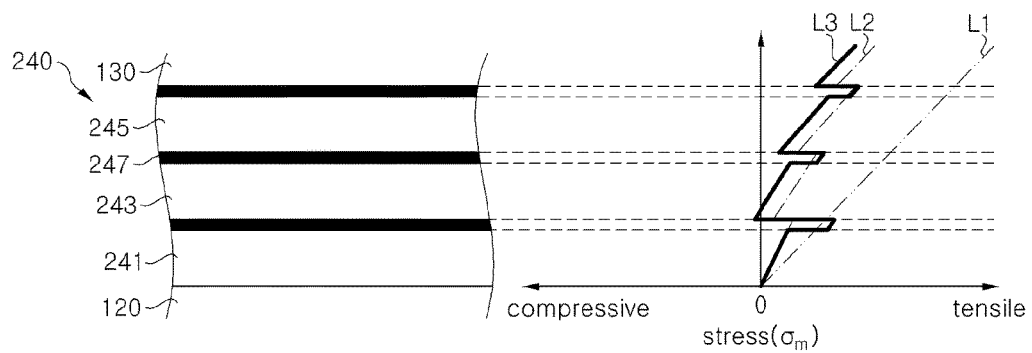

[Fig. 8]
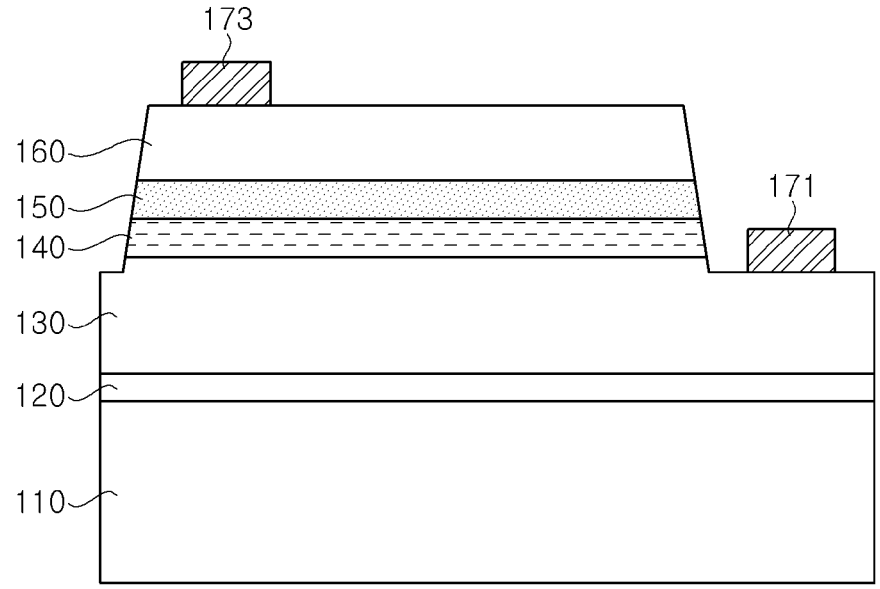
[Fig. 9]
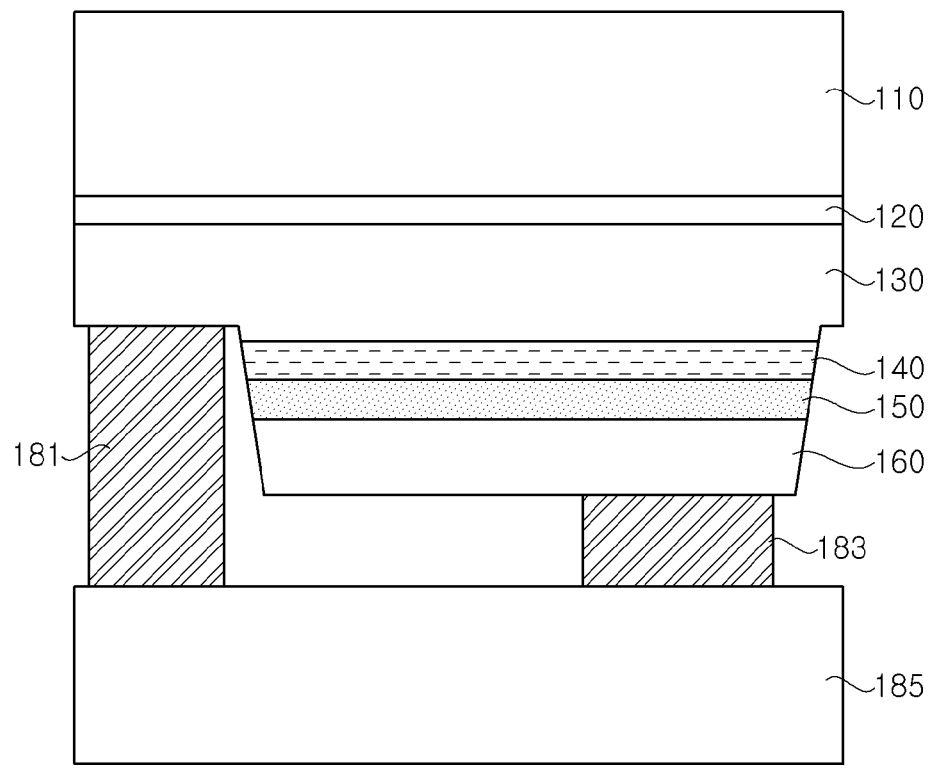

[Fig. 10]
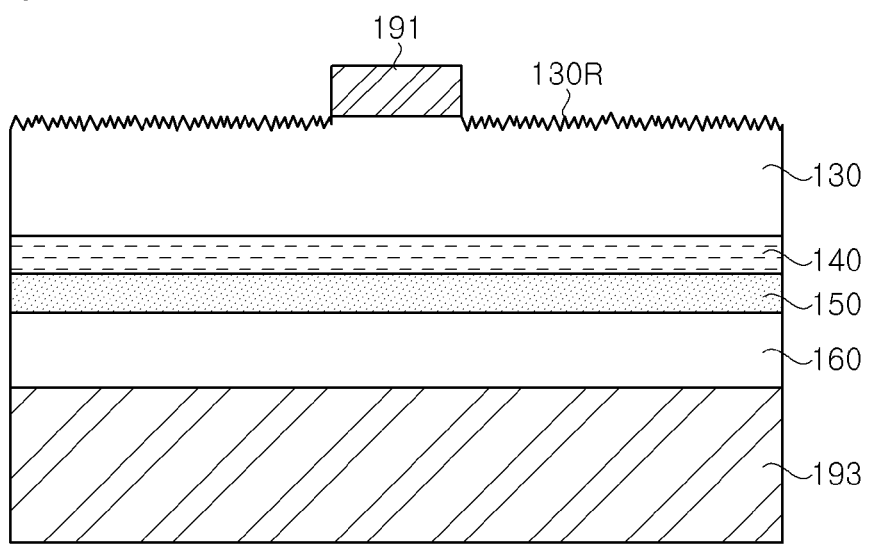

UV LIGHT EMITTING DIODE HAVING A STRESS ADJUSTMENT LAYER

TECHNICAL FIELD

Exemplary embodiments of the present disclosure relate to an ultraviolet (UV) light emitting diode, and more particularly, to a UV light emitting diode including a stress adjustable layer to improve crystallinity of semiconductor layers.

BACKGROUND ART

Since a UV light emitting diode emits light having a relatively short peak wavelength (generally, a peak wavelength of 400 nm or less), a light emitting region is formed of AlGaN containing 10% or more of Al in fabrication of a UV light emitting diode using a nitride semiconductor. In such a UV light emitting diode, if n-type and p-type nitride semiconductor layers have smaller energy band-gaps than energy of UV light emitted from an active layer, UV light emitted from the active layer can be absorbed into the n-type and p-type nitride semiconductor layers in the light emitting diode. Then, the light emitting diode suffers from significant deterioration in luminous efficacy. Accordingly, not only the active layer of the UV light emitting diode, but also other semiconductor layers placed in a light emitting direction of the UV light emitting diode, particularly, an n-type semiconductor layer, contain 10% or more of Al.

In fabrication of a UV light emitting diode, a sapphire substrate is generally used as a growth substrate. However, when $Al_xGa_{(1-x)}N$ layer ($0.1 \leq x \leq 1$) containing 10% or more of Al is grown on the sapphire substrate, the UV light emitting diode suffers from cracking or breaking caused by thermal or structural deformation due to a high Al composition ratio. This problem is caused by lattice mismatch or a difference in coefficient of thermal expansion between the sapphire substrate and the $Al_xGa_{(1-x)}N$ layer ($0.1 \leq x \leq 1$). Specifically, due to a difference in coefficient of thermal expansion between the sapphire substrate having a relatively high coefficient of thermal expansion and a nitride semiconductor having a relatively low coefficient of thermal expansion, a wafer suffers from bowing into a concave shape upon growth of the nitride semiconductor at high temperature (at about 1000° C. or more). When the growth temperature is decreased again, the wafer is flattened again or bowed into a convex shape. Due to bowing of the wafer, tensile stress gradually increases in an upward direction of the wafer, thereby causing generation of cracks in the nitride semiconductor. Such cracks cause deterioration in production yield and quality of light emitting diodes.

DISCLOSURE OF INVENTION

Technical Problem

Exemplary embodiments of the present disclosure provide a UV light emitting diode that includes semiconductor layers having improved crystallinity by reducing a probability of generating cracks in the semiconductor layers.

Solution to Problem

In accordance with one aspect of the present disclosure, a UV light emitting diode includes: a first conductive type semiconductor layer; a first stress adjustment layer disposed on the first conductive type semiconductor layer, and including a first nitride layer including Al and a second nitride layer disposed on the first nitride layer and having a lower Al composition ratio than the first nitride layer; an active layer disposed on the first stress adjustment layer; and a second conductive type semiconductor layer disposed on the active layer, wherein the first stress adjustment layer includes an Al delta layer inserted in the first nitride layer, and a lower surface of the first nitride layer in which the Al delta layer is inserted has greater average tensile stress than a lower surface of the second nitride layer directly disposed on the first nitride layer in which the Al delta layer is inserted.

In accordance with another aspect of the present disclosure, a UV light emitting diode includes: a first conductive type semiconductor layer; a stress adjustment layer disposed on the first conductive type semiconductor layer and including a multilayer structure and an Al delta layer inserted in at least one of layers constituting the multilayer structure; an active layer disposed on the stress adjustment layer; and a second conductive type semiconductor layer disposed on the active layer, wherein a lattice parameter of the Al delta layer is less than an average lattice parameter of the stress adjustment layer, and the stress adjustment layer applies greater compressive stress to other layers disposed on the stress adjustment layer than compressive stress applied by a single layer having the same composition ratio as an average composition ratio of the stress adjustment layer.

In accordance with a further aspect of the present disclosure, a method of fabricating a UV light emitting diode includes: forming a first conductive type semiconductor layer on a growth substrate; forming a first stress adjustment layer on the first conductive type semiconductor layer, the first stress adjustment layer including a first nitride layer including Al and a second nitride layer disposed on the first nitride layer and having a lower Al composition ratio than the first nitride layer; forming an active layer on the first stress adjustment layer; and forming a second conductive type semiconductor layer on the active layer, wherein forming the first stress adjustment layer can include forming an Al delta layer inserted in the first nitride layer, and a lower surface of the first nitride layer in which the Al delta layer is inserted has greater average tensile stress than a lower surface of the second nitride layer directly disposed on the first nitride layer.

Advantageous Effects of Invention

According to exemplary embodiments, a UV light emitting diode including a stress adjustment layer disposed on a first conductive type semiconductor layer is provided. The stress adjustment layer prevents compressive stress in semiconductor layers from relieving, that is, prevents increase in tensile stress, thereby preventing generation of cracks in an upper portion of the first conductive type semiconductor layer, an active layer and a second conductive type semiconductor layer. According to the exemplary embodiments, it is possible to increase production yield of UV light emitting diodes while improving crystallinity of the UV light emitting diode.

BRIEF DESCRIPTION OF DRAWINGS

FIG. 1 is a sectional view of a UV light emitting diode according to exemplary embodiments.

FIG. 2 is an enlarged sectional view of a stress adjustment layer according to exemplary embodiments.

FIG. 3a shows schematic sectional views illustrating a bowing phenomenon of a wafer in a process of fabricating a light emitting diode, and FIG. 3b and FIG. 3c are sectional views and graphs illustrating average stress variation in a stress adjustment layer according to exemplary embodiments.

FIG. 4 to FIG. 6 are enlarged sectional views of the stress adjustment layer according to exemplary embodiments.

FIG. 7a and FIG. 7b are sectional views of a UV light emitting diode according to exemplary embodiments.

FIG. 8 is a sectional view of a light emitting diode according to exemplary embodiments.

FIG. 9 is a sectional view of a light emitting diode according to exemplary embodiments.

FIG. 10 is a sectional view of a light emitting diode according to exemplary embodiments.

MODE FOR THE INVENTION

A UV light emitting diode according to various exemplary embodiments and a method of fabricating the same can be realized in various ways.

A UV light emitting diode according to some exemplary embodiments includes: a first conductive type semiconductor layer; a first stress adjustment layer disposed on the first conductive type semiconductor layer, and including a first nitride layer including Al and a second nitride layer disposed on the first nitride layer and having a lower Al composition ratio than the first nitride layer; an active layer disposed on the first stress adjustment layer; and a second conductive type semiconductor layer disposed on the active layer, wherein the first stress adjustment layer includes an Al delta layer inserted in the first nitride layer, and a lower surface of the first nitride layer in which the Al delta layer is inserted has greater average tensile stress than a lower surface of the second nitride layer directly disposed on the first nitride layer in which the Al delta layer is inserted.

The first stress adjustment layer can have a multilayer structure in which the first nitride layer and the second nitride layer are repeatedly stacked one above another, and can include the Al delta layer inserted in at least one first nitride layer among the first nitride layers, and the Al delta layer can have a higher Al composition ratio than the first nitride layer in which the Al delta layer is inserted.

The multilayer structure in which the first nitride layer and the second nitride layer are repeatedly stacked can be a super lattice structure.

In the at least one first nitride layer among the first nitride layers, the Al delta layer can be placed closer to one second nitride layer disposed on an upper surface of the at least one first nitride layer than another second nitride layer disposed under a lower surface of the at least one first nitride layer.

The Al delta layer can adjoin the other second nitride layer disposed on the upper surface of the at least one first nitride layer.

The Al delta layers can be inserted at regular intervals in the first nitride layers.

The Al delta layers can be inserted at irregular intervals in the first nitride layers.

The Al delta layers can be inserted in some of the first nitride layers and a distance between the Al delta layers can gradually decrease in a direction toward the active layer.

The Al delta layer can have a gradually increasing Al composition ratio in a direction from the first conductive type semiconductor layer to the active layer.

The first nitride layer can include $Al_xGa_{(1-x)}N$ (0<x<1), the second nitride layer can include $Al_yGa_{(1-y)}N$ (0<y<1), and the Al delta layer can include $Al_zGa_{(1-z)}N$ (0<z≤1, y<x<z).

The Al delta layer can be formed of $Al_zGa_{(1-z)}N$ (0.8≤z≤1).

The UV light emitting diode can further include a first electrode disposed under the first conductive type semiconductor layer and a second electrode disposed on the second conductive type semiconductor layer.

The UV light emitting diode can further include a growth substrate disposed under the first conductive type semiconductor layer, wherein the growth substrate can have a higher coefficient of thermal expansion than the first conductive type semiconductor layer.

Each of the first and second nitride layers can have a thickness of 5 nm to 30 nm.

The active layer can emit light having a peak wavelength of 270 nm to 315 nm.

In some exemplary embodiments, the UV light emitting diode can further include a second stress adjustment layer disposed under the first conductive type semiconductor layer and including a plurality of nitride layers, wherein the second stress adjustment layer includes an Al delta layer inserted in at least one nitride layer among the plurality of nitride layers, and the Al delta layer has a higher Al composition ratio than the nitride layer in which the Al delta layer is inserted.

Each of the plurality of nitride layers of the second stress adjustment layer can have a gradually decreasing Al composition ratio in a direction toward the first conductive type semiconductor layer.

Each of the first and second nitride layers can have gradually increasing average tensile stress in a direction from the first conductive type semiconductor layer to the active layer, and an average tensile stress increase rate in the first nitride layer can be greater than the average tensile stress increase rate in the second nitride layer in the direction from the first conductive type semiconductor layer to the active layer.

A UV light emitting diode according to other exemplary embodiments includes: a first conductive type semiconductor layer; a stress adjustment layer disposed on the first conductive type semiconductor layer and including an Al delta layer inserted in at least one layer of the multilayer structure; an active layer disposed on the stress adjustment layer; and a second conductive type semiconductor layer disposed on the active layer, wherein a lattice parameter of the Al delta layer is less than an average lattice parameter of the stress adjustment layer, and the stress adjustment layer applies higher compressive stress to other layers disposed above the stress adjustment layer than the compressive stress applied by a single layer having the same composition ratio as an average composition ratio of the stress adjustment layer.

The Al delta layer can be formed of $Al_zGa_{(1-z)}N$ (0.8≤z≤1).

A method of fabricating a UV light emitting diode according to yet another exemplary embodiment includes: forming a first conductive type semiconductor layer on a growth substrate; forming a first stress adjustment layer on the first conductive type semiconductor layer, the first stress adjustment layer including a first nitride layer including Al and a second nitride layer disposed on the first nitride layer and having a lower Al composition ratio than the first nitride layer; forming an active layer on the first stress adjustment layer; and forming a second conductive type semiconductor layer on the active layer, wherein the forming the first stress adjustment layer can include forming an Al delta layer inserted in the first nitride layer, and a lower surface of the first nitride layer in which the Al delta layer is inserted has greater average tensile stress than a lower surface of the second nitride layer directly disposed on the first nitride layer.

The forming the first stress adjustment layer can include growing the first nitride layer under first growth conditions, and growing the second nitride layer on the first nitride layer under second growth conditions, and the Al delta layer can be grown during a period of time for which growth conditions are changed from the first growth conditions to the second growth conditions.

The forming the first stress adjustment layer can include growing the first nitride layer under first growth conditions, growing the Al delta layer under third growth conditions, and growing the second nitride layer on the first nitride layer under second growth conditions.

The growing the Al delta layer can include inserting the Al delta layer into the first nitride layer during growth of the first nitride layer.

The forming the stress adjustment layer can include repeatedly stacking the first and second nitride layers, and the Al delta layer can be inserted in at least one of the first nitride layers.

The Al delta layer can adjoin the second nitride layer.

The first and second nitride layers can be repeatedly stacked one above another to form a super lattice structure.

The method can further include, before formation of the first conductive type semiconductor layer, forming a second stress adjustment layer on the growth substrate, the second stress adjustment layer including a plurality of nitride layers, and the forming the second stress adjustment layer can include forming the Al delta layer inserted in at least one of the plurality of nitride layers.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. It will be understood that when an element such as a layer, film, region or substrate is referred to as being "on" another element, it can be directly on the other element or intervening elements can also be present. In contrast, when an element is referred to as being "directly on" another element, there are no intervening elements present. Throughout the specification, like reference numerals denote like elements having the same or similar functions.

It should be understood that respective composition ratios, growth methods, growth conductions, and thicknesses of semiconductor layers described below are provided for illustration only and do not limit the scope of the present disclosure. For example, when a certain semiconductor layer is represented by AlGaN, a composition ratio of Al and Ga in the semiconductor layer can be determined in various ways as needed. Furthermore, semiconductor layers described below can be grown by various methods generally known to a person having ordinary knowledge in the art (hereinafter, "those skilled in the art"), for example, metal organic chemical vapor deposition (MOCVD), molecular beam epitaxy (MBE), hydride vapor phase epitaxy (HVPE), and the like. In the following exemplary embodiments, semiconductor layers will be described as being grown in the same chamber by MOCVD. During growth of semiconductor layers, sources introduced into a chamber can be selected from sources known to those skilled in the art, for example, TMGa, TEGa and the like as Ga sources, TMAl, TEAl and the like as Al sources, TMIn, TEIn, and the like as In sources, and $NH_3$ as a N sources, without being limited thereto.

Although the following exemplary embodiments will be described as a method of fabricating a single UV light emitting diode, it should be understood that the present disclosure is not limited thereto. The following exemplary embodiments can also be applied to fabrication of a wafer for fabrication of a plurality of light emitting diodes on a substrate having a size of several inches or more.

FIG. 1 is a sectional view of a UV light emitting diode according to exemplary embodiments, and FIG. 2 to FIG. 5 are enlarged sectional views of a stress adjustment layer according to exemplary embodiments.

Referring to FIG. 1, the UV light emitting diode according to this exemplary embodiment includes a first conductive type semiconductor layer 130, a stress adjustment layer 140, an active layer 150, and a second conductive type semiconductor layer 160. The UV light emitting diode can further include a growth substrate 110 and a buffer layer 120.

The growth substrate 110 can be placed at a base of the UV light emitting diode. The growth substrate 110 can be selected from any substrates that allow growth of nitride semiconductor layers thereon, and can be, for example, a sapphire substrate, a silicon carbide substrate, a spinel substrate, or a nitride substrate such as a GaN substrate or an AlN substrate. Particularly, in this exemplary embodiment, the growth substrate 110 can be a sapphire substrate. Particularly, the growth substrate 110 according to this exemplary embodiment can have a lower coefficient of thermal expansion than nitride semiconductor layers formed on the growth substrate 110.

The growth substrate 110 can be removed as needed. For example, after growth of semiconductor layers on the growth substrate 110, the growth substrate 110 can be removed from the semiconductor layers according to the structure of the light emitting diode.

The buffer layer 120 can act as a nucleus layer so as to allow growth of other semiconductor layers thereon, and can also serve to relieve stress due to a difference in lattice parameter between the sapphire substrate and other semiconductor layers formed thereon. Particularly, in an exemplary embodiment wherein the growth substrate 110 is a heterogeneous substrate, such as a sapphire substrate, with respect to nitride semiconductors, the buffer layer 120 enables efficient growth of a single crystal nitride semiconductor.

The buffer layer 120 can include Ga, for example, GaN. The buffer layer 120 can be grown to a thickness of about 25 nm or less on the growth substrate 110, and can be grown at a temperature of about 600° C. and a pressure of 600 Torr. Further, the GaN layer can include a 2D growth layer and a 3D growth layer. In this exemplary embodiment, the buffer layer 120 is formed of a nitride semiconductor including GaN, thereby further facilitating separation of the growth substrate 110 through laser lift-off.

The buffer layer 120 can further include an undoped layer disposed on the GaN layer. The undoped layer can include GaN and can be grown at a temperature of about 900° C. to 1100° C. and a pressure of about 200 Torr by supplying a Ga source and an N source into the growth chamber. The undoped layer can be grown to a thickness of about 1 μm to 1.2 μm. Alternatively, the undoped layer can further include Al, the content of which can be adjusted such that the undoped layer can absorb a laser beam in a laser lift-off process. For example, the undoped layer can include about 40% or less of Al, preferably, 20% or less of Al.

In the light emitting diode according to this exemplary embodiment, the buffer layer 120 including Ga is grown on the growth substrate 110, whereby a laser beam emitted for separation of the growth substrate 110 can be absorbed into the buffer layer 120, particularly, into the undoped layer. Accordingly, in fabrication of the light emitting diode according to this exemplary embodiment, separation of the growth substrate through laser lift off can be facilitated. Furthermore, GaN grown on the growth substrate 110 has a lower defect density than AlN. Accordingly, the buffer layer 120 including GaN having relatively good crystallinity is formed before growth of n-type semiconductor layers, thereby improving overall crystallinity of the light emitting diode, as compared with growth of an AlN layer before growth of the n-type semiconductor layer in the related art.

In some exemplary embodiments, the buffer layer 120 can be omitted, as needed, or can be additionally removed after separation of the growth substrate 110 in fabrication of the light emitting diode.

The first conductive type semiconductor layer 130 can include a nitride semiconductor including Al. For example, the first conductive type semiconductor layer 130 can be grown by supplying group III element sources including an Al source, an N source, and a dopant source into the growth chamber. For example, the first conductive type semiconductor layer 130 can be grown by introducing TMAl and TMGa as the group III element sources, $NH_3$ as the N source, and silane as the dopant source into the growth chamber. In the growth chamber, the growth temperature can be set in the range of about 1050° C. to 1150° C. Although the growth pressure is not particularly limited, the growth pressure can be, for example, about 200 Torr. Furthermore, the Al composition ratio of the first conductive type semiconductor layer 130 is not particularly limited and can be adjusted in a wide range depending upon the peak wavelength of light emitted from the active layer 150. For example, the first conductive type semiconductor layer 130 can have an Al composition ratio of 0.2 or more, specifically 0.4 or more. The first conductive type semiconductor layer 130 can include Si in a concentration of, for example, $1 \times 10^{18}$ $cm^{-1}$ or more, and thus exhibit n-type conductivity. Here, it should be understood that the dopant for the first conductive type semiconductor layer 130 is not limited to Si and can include various dopants such as Ge, C, Sn, and the like.

The first conductive type semiconductor layer 130 can be composed of a single layer or multiple layers. In an exemplary embodiment wherein the first conductive type semiconductor layer 130 is composed of multiple layers, the first conductive type semiconductor layer 130 can include a contact layer, a clad layer, and the like, and can further include a super lattice layer.

The stress adjustment layer 140 is disposed on the first conductive type semiconductor layer 130. The stress adjustment layer 140 can be composed of multiple layers and can include a stack structure in which at least two layers having different composition ratios, particularly, different Al composition ratios, are stacked one above another. In some exemplary embodiments, the stress adjustment layer 140 can include a super lattice structure in which at least two layers having different Al composition ratios are stacked at regular intervals one above another. Furthermore, the stress adjustment layer 140 can further include an Al delta layer 145 having a relatively high Al composition ratio. The stress adjustment layer 140 generates compressive stress, thereby relieving increase in tensile stress of the first conductive type semiconductor layer 130. Furthermore, the stress adjustment layer 140 generates compressive stress, thereby allowing average stress on the surface of the first conductive type semiconductor layer 130 to become compressive stress. Particularly, the stress adjustment layer 140 can increase compressive stress applied to other layers (for example, the active layer 150) disposed on the stress adjustment layer 140, as compared with a bulky layer (that is, formed as a single layer).

Furthermore, a lattice parameter of the Al delta layer 145 is less than an average lattice parameter of the stress adjustment layer 140. Such a multilayer structure of the stress adjustment layer 140 and the Al delta layer 145 can apply greater compressive stress to the other layers (for example, the active layer 150 and the second conductive type semiconductor layer 160) disposed on the stress adjustment layer 140 than compressive stress applied by a single layer having the same composition ratio as an average composition ratio of the stress adjustment layer 140. That is, the stress adjustment layer 140 which includes the multilayer structure and/or the Al delta layer 145 can apply greater compressive stress to the other layers disposed on the stress adjustment layer 140 than the stress adjustment layer which is formed of single layer (bulk single layer).

Next, referring to FIG. 2 to FIG. 6c, the stress adjustment layer 140 according to various exemplary embodiments will be described in more detail.

First, FIG. 2 is an enlarged sectional view of a stress adjustment layer according to one exemplary embodiment.

Referring to FIG. 2, the stress adjustment layer 140 includes a stack structure of at least two layers having different Al composition ratios. Specifically, the stress adjustment layer 140 includes a first nitride layer 141 and a second nitride layer 143 disposed on the first nitride layer 141. The first nitride layer 141 has a higher Al composition ratio than the second nitride layer 143. In some exemplary embodiments, the stress adjustment layer 140 can include a periodic stack structure in which the first and second nitride layers 141, 143 are stacked at regular intervals one above another to form a super lattice structure. Accordingly, in a band-gap energy diagram of the stack structure in which the first nitride layer 141 and the second nitride layer 143 are repeatedly stacked one above another, it can be seen that pluralities of energy well layers and barrier layers are provided. In this diagram, the first nitride layers 141 can correspond to the barrier layers and the second nitride layers 143 can correspond to the well layers.

In some exemplary embodiments, the first nitride layers 141 and the second nitride layers 143 can include AlGaN having different composition ratios. In one exemplary embodiment, the first nitride layers 141 can include $Al_xGa_{(1-x)}N$ layers (0<x<1) and the second nitride layers 143 can include $Al_yGa_{(1-y)}N$ layers (0<y<1, y<x). The first and second nitride layers 141, 143 can be grown to have different composition ratios by supplying different fluxes of group III element sources upon growth thereof. In another exemplary embodiment, the first and second nitride layers 141, 143 can be grown to have different composition ratios by supplying the same flux of sources under different growth pressures upon growth thereof. In this exemplary embodiment, under the same growth conditions excluding pressure in the growth chamber, the Al composition ratio of the AlGaN layers increases with decreasing pressure. Furthermore, the first and second nitride layers 141, 143 can further include an n-type dopant to exhibit n-type conductivity, or can be in an undoped state.

Furthermore, the stress adjustment layer 140 can include the Al delta layer 145 having a relatively high Al composition ratio. The Al delta layer 145 can be inserted in a layer having a higher Al composition ratio than the other layer among the nitride layers having different Al composition ratios. In this exemplary embodiment, the Al delta layers 145 can be inserted in the first nitride layers 141 and can have a higher Al composition ratio than the first nitride layers 141.

Specifically, as shown in FIG. 2, the Al delta layer 145 inserted in the first nitride layer 141 can substantially adjoin the second nitride layer 143 placed on the first nitride layer 141. Thus, in this exemplary embodiment, the Al delta layer 145 can be placed at the uppermost portion of each of the first nitride layers 141 in which the Al delta layers 145 are placed. However, the present disclosure is not limited thereto and the Al delta layer 145 can be separated from the second nitride layer 143 disposed thereon. For example, as in the stress adjustment layer 140a shown in FIG. 4, the Al delta layer 145 can be placed inside the first nitride layer 141 while being separated from the second nitride layer 143 disposed on the first nitride layer 141. Even in this exemplary embodiment, however, the Al delta layer 145 can be placed closer to one second nitride layer 143 disposed on an upper surface of the first nitride layer 141, in which the Al delta layer 145 is inserted, than another second nitride layer 143 disposed under a lower surface of the first nitride layer 143, in which the Al delta layer 145 is inserted. The Al delta layer 145 having a relatively high Al composition ratio is closer to the second nitride layer 143 having a lower Al composition ratio than the first nitride layer 141, thereby further improving the effect of preventing stress reduction (that is, the effect of preventing increase in tensile stress by increasing a compressive stress factor) by the stress adjustment layer 140.

In addition, the Al delta layer 145 can include a nitride semiconductor including Al, and in some exemplary embodiments, the Al delta layer 145 can include $Al_zGa_{(1-z)}N$ ($0<z\leq1$). In this formula, z is a composition ratio of Al and can range, for example, from 0.8 to 1. The Al delta layer 145 can have an Al composition ratio of 0.8 or more, thereby further improving a stress adjustment effect through the Al delta layer 145. It should be understood that the present disclosure is not limited to the above Al composition ratio. The Al delta layer 145 can have a thickness of several nanometers.

According to the exemplary embodiments, the stress adjustment layer 140 can include a super lattice structure and the Al delta layer 145 to prevent generation of cracks by preventing stress in an upper region of the first conductive type semiconductor layer 130 from being relieved to generate tensile stress. This structure will be described in more detail with reference to FIG. 3a to FIG. 3c. FIG. 3a shows schematic sectional views illustrating a bowing phenomenon of a wafer in a process of fabricating a light emitting diode, and FIG. 3b and FIG. 3c are sectional views and graphs illustrating average stress variation in stress adjustment layers according to exemplary embodiments.

First, referring to (a) of FIG. 3a, an upper side of a wafer 100 having semiconductor layers grown thereon is bowed into a concave shape during growth of the first conductive type semiconductor layer 130. This deformation is caused by a higher coefficient of thermal expansion of the growth substrate 110 than the nitride semiconductors, and such a bowing phenomenon can become severer when there is a layer (for example, the buffer layer 120) grown at a lower growth temperature than the first conductive type semiconductor layer 130 before growth of the first conductive type semiconductor layer 130. Next, referring to (b) of FIG. 3a, after growth of the first conductive type semiconductor layer 130, the active layer 150 is grown at a lower growth temperature than the first conductive type semiconductor layer 130, thereby reducing the degree of bowing of the wafer 100 during growth of the active layer 150. Next, referring to (c) of FIG. 3a, after growth of the semiconductor layers, when the temperature of the wafer 100 is decreased to a temperature corresponding to an electrode formation process temperature or room temperature, the upper side of the wafer 100 is bowed into a convex shape. This deformation is caused by a difference in coefficient of thermal expansion between the nitride layers and the growth substrate 110, as described above.

When the wafer 100 is bowed into a convex shape, tensile stress is applied to the nitride semiconductor layers disposed on the growth substrate 110. Such tensile stress gradually increases in an upward direction of the wafer 100, thereby causing cracking of the semiconductor layers. Particularly, the first conductive type semiconductor layer 130 having a relatively thick thickness can suffer from cracks, which in turn propagate to the active layer 150 and the second conductive type semiconductor layer 160, thereby deteriorating crystallinity of the semiconductor layers. Moreover, generation of cracks can cause deterioration in production yield and reliability of the light emitting diode. Accordingly, the compressive stress factor in the upper region of the first conductive type semiconductor layer 130 is reinforced, thereby preventing generation of cracks due to increase in tensile stress.

Referring to FIG. 3b, reinforcement of the compressive stress factor and decrease in tensile stress by the stress adjustment layer 140 will be described. A graph at the right side of FIG. 3b shows average stress ($\sigma_m$) depending upon a growth direction of the stress adjustment layer 140. In FIG. 3b, compressive stress and tensile stress do not mean specific values and are provided for comparison of stress factors. Thus, a median value 0 between compressive stress and tensile stress does not mean that stress applied to the corresponding layer is 0, and corresponds to a reference value for comparison of a relative stress factor.

In the graph of FIG. 3b, Line L1 indicates variation of average stress in the structure wherein the stress adjustment layer 140 is composed of a single layer and Line L2 indicates variation of average stress in the structure wherein the stress adjustment layer 140 has a multilayer structure, particularly, a super lattice structure. Since the first nitride layer 141 has a higher Al composition ratio than the second nitride layer 143, the lattice parameter of the first nitride layer 141 is less than that of the second nitride layer 143. First, at a first interface IF1 between the first nitride layer 141 (placed at a lower side) and the second nitride layer 143 (placed at an upper side), compressive stress arises on an upper side of the first interface IF1 since the second nitride layer 143 has a higher lattice parameter. Tensile stress increases in an upward direction from the first interface IF1. Then, at a second interface IF2 between the second nitride layer 143 (placed at a lower side) and the first nitride layer 141 (placed at an upper side), tensile stress arises on an upper side of the second interface IF2 since the first nitride layer 141 has a lower lattice parameter. Here, since tensile stress gradually increasing in the upward direction is continuously applied to the stress adjustment layer 140, the magnitude (absolute value) of compressive stress increasing at the first interface IF1 is greater than the magnitude (absolute value) of tensile stress increasing at the second interface IF2. Accordingly, the stress adjustment layer 140 in which the first and second nitride layers 141, 143 are repeatedly stacked one above another is subjected to tensile stress gradually decreasing in the upward direction, as compared with the stress adjustment layer composed of a single layer. In this way, the stress adjustment layer 140 having the super lattice structure can reduce tensile stress in the upper region of the first conductive type semiconductor layer 130. On the other hand, even in the case where tensile stress applied to an upper region on the second interface IF2 increases, cracks do not occur in this region since the first nitride layer 141 and the second nitride layer 143 have very small thicknesses (several to dozens of nanometers).

Referring to FIG. 3c, reinforcement of the compressive stress factor and decrease in tensile stress by the stress adjustment layer 140 including the Al delta layer 145 according to this exemplary embodiment will be described. A graph at the right side of FIG. 3c shows average stress ($\sigma_m$) depending upon a growth direction of the stress adjustment layer 140. In FIG. 3c, compressive stress and tensile stress do not mean specific values and are provided for comparison of stress factors. Thus, a median value 0 between compressive stress and tensile stress does not mean that stress applied to the corresponding layer is 0, and corresponds to a reference value for comparison of a relative stress factor.

In the graph of FIG. 3c, Line L2 indicates variation of average stress in the structure wherein the stress adjustment layer 140 does not include the Al delta layer 145 and Line L3 indicates variation of average stress in the structure wherein the stress adjustment layer 140 includes the Al delta layers 145. Since the first nitride layer 141 has a higher Al composition ratio than the second nitride layer 143, the lattice parameter of the first nitride layer 141 is less than that of the second nitride layer 143. In addition, since the Al delta layer 145 has a higher Al composition ratio than the first nitride layer 141, the lattice parameter of the Al delta layer 145 is less than that of the first nitride layer 141.

First, since variation in average stress ($\sigma_m$) at the first interface IF1 and the second interface IF2 is generally similar to the variation in average stress shown in FIG. 3b, a detailed description thereof will be omitted. At a third interface IF3 between the first nitride layer 141 (placed at a lower side) and the Al delta layer 145 (placed at an upper side), tensile stress arises on an upper side of the third interface IF3 since the first nitride layer 141 has a higher lattice parameter. Tensile stress increases in an upward direction from the third interface IF3. Then, at a fourth interface IF4 between the Al delta layer 145 (placed at a lower side) and the second nitride layer 143 (placed at an upper side), compressive stress arises on an upper side of the fourth interface IF4 since the Al delta layer 145 has a lower lattice parameter. Here, since tensile stress gradually increasing in the upward direction is continuously applied to the stress adjustment layer 140, the magnitude (absolute value) of compressive stress increasing at the fourth interface IF4 is greater than the magnitude (absolute value) of tensile stress increasing at the third interface IF3. Accordingly, the stress adjustment layer 140 including the Al delta layer 145 is subjected to tensile stress gradually decreasing in the upward direction, as compared with the stress adjustment layer not including the Al delta layer 145. In this way, the stress adjustment layer 140 including the Al delta layer 145 can further reduce tensile stress in the upper region of the first conductive type semiconductor layer 130. On the other hand, even in the case where tensile stress applied to an upper region on the third interface IF3 increases, cracks do not occur in this region since the Al delta layer 145 has a very small thickness (several nanometers).

Referring to FIG. 2 again, the Al delta layers 145 can be inserted at regular intervals or at irregular intervals in the stress adjustment layer 140. In one exemplary embodiment, the Al delta layers 145s can be inserted in a predetermined cycle into the structure wherein the first and second nitride layers 141, 143 are repeatedly stacked one above another. For example, as shown in FIG. 2, the Al delta layers 145 can be regularly inserted in a cycle of three pairs of first and second nitride layers 141, 143 repeatedly stacked one above another. It should be understood that the present disclosure is not limited to a particular cycle in which the Al delta layer 145 is inserted.

In other exemplary embodiments, the Al delta layers 145 can be inserted at irregular intervals in the structure in which the first and second nitride layers 141, 143 are repeatedly stacked one above another. For example, as shown in FIG. 5, irrespective of a stacking cycle of the first and second nitride layers 141, 145, the Al delta layers 145 can be irregularly inserted in the first nitride layer 141.

In some exemplary embodiments, the Al delta layers 145 can be inserted in some first nitride layers 141 among the first nitride layers 141 in the stress adjustment layer 140 to be arranged such that the distance between the Al delta layers 145 gradually decreases in an upward direction (in a direction toward the active layer 150). For example, as shown in FIG. 6, in the structure wherein first to fourth Al delta layers 145a to 145d are placed inside the first nitride layers 141, the distance between the first Al delta layer 145a and the second Al delta layer 145b is defined as D1, the distance between the second Al delta layer 145b and the third Al delta layer 145c is defined as D2, and the distance between the third Al delta layer 145c and the fourth Al delta layer 145d is defined as D3. Here, D1 can be greater than D2, and D2 can be greater than D3. As such, in the structure wherein the distance between the Al delta layers 145 gradually decreases in the upward direction, tensile stress in the upper region of the stress adjustment layer 140 can be further reduced.

In some exemplary embodiments, each of the Al delta layers 145 can have an Al concentration gradient due to change of the Al concentration therein. In one Al delta layer 145, the Al concentration can be gradually increased in the direction of the active layer 150. Since the Al concentration increases inside the Al delta layer 145, it is possible to reduce lattice mismatch between the first nitride layer 141 and the Al delta layer 145 at a lower surface of the Al delta layer 145 (at the third interface IF3). Accordingly, it is possible to reduce tensile stress which increases at the third interface IF3.

Furthermore, the plurality of Al delta layers 145 can have different Al concentrations. For example, the Al concentration of the Al delta layer 145 placed at a lower side can be lower than that of the Al delta layer 145 placed at an upper side. With the structure wherein the Al delta layer 145 having a higher Al concentration is disposed relatively close to the active layer 150, the light emitting diode can more effectively prevent generation of cracks in the active layer 150.

Referring to FIG. 1 again, the active layer 150 is disposed on the stress adjustment layer 140.

The active layer 150 can include (Al, Ga, In)N and can emit light having a peak wavelength in a predetermined UV range through adjustment of composition ratios of nitride semiconductors. For example, the active layer 150 can emit light having a peak wavelength of about 270 nm to about 315 nm, without being limited thereto. The active layer 150 can include barrier layers (not shown) and well layers (not shown) alternately stacked one above another to form a multi-quantum well (MQW) structure. For example, the active layer 150 can be obtained by forming barrier layers and well layers using an Al-containing nitride semiconductor at a temperature of about 700° C. to 900° C. and a pressure of about 100 Torr to 400 Torr. Furthermore, the barrier layers and/or the well layers of the active layer 150 can contain indium (In) and can be formed of, for example, a quaternary nitride semiconductor such as AlInGaN.

In addition, among the barrier layers of the active layer 150, the nearest barrier layer to the first conductive type semiconductor layer 130 can have a higher Al content than other barrier layers. The nearest barrier layer to the first conductive type semiconductor layer 130 is formed to have a greater band gap than other barrier layers, whereby overflow of electrons can be effectively prevented through decrease in movement speed of the electrons.

The second conductive type semiconductor layer 160 can be formed on the active layer 150. The second conductive type semiconductor layer 160 can be formed to a thickness of about 0.2 μm or less by supplying a group III element source, an N source and a dopant source into a chamber at a temperature of about 900° C. to 1000° C. and a pressure of about 100 Torr to 400 Torr. The second conductive type semiconductor layer 160 can include a nitride semiconductor such as AlGaN or GaN, and can further include a dopant, such as Mg, with which a p-type layer is formed.

Furthermore, the second conductive type semiconductor layer 160 can further include a delta-doping layer (not shown) to reduce ohmic contact resistance, and can further include an electron-blocking layer (not shown). The electron-blocking layer can include an AlGaN layer. Further, the electron-blocking layer can include a first electron-blocking layer (not shown) and a second electron-blocking layer (not shown) placed on the first electron-blocking layer, wherein the first electron-blocking layer can have a higher Al composition ratio than the second electron-blocking layer.

On the other hand, the first conductive type semiconductor layer 130, the active layer 150 and the second conductive type semiconductor layer 160 can further include additional layers. For example, the semiconductor layers 130, 150, 160 can further include a super lattice layer, a high density doped layer, and the like, thereby improving crystallinity and luminous efficacy of the light emitting diode.

The UV light emitting diode according to this exemplary embodiment can be fabricated by forming the first conductive type semiconductor layer 130, the stress adjustment layer 140, the active layer 150 and the second conductive type semiconductor layer 160 on the growth substrate 110. The method of fabricating the UV light emitting diode can further include forming the buffer layer 120 before forming the first conductive type semiconductor layer 130. Each of the semiconductor layers can be grown in an MOVCD chamber by supplying group III element sources, an N source, and a dopant source into a growth chamber.

Particularly, forming the stress adjustment layer 140 can include forming a multilayer structure of nitride layers, and can further include forming the Al delta layer 145 inserted in at least one layer of the multilayer structure. In some exemplary embodiments, the Al delta layer 145 can be formed of remaining sources in the growth chamber during change of growth conditions in the growth chamber in order to grow another nitride layer after growth of one nitride layer. Alternatively, separate sources for formation of the Al delta layer 145 can be supplied into the growth chamber.

For example, forming the stress adjustment layer 140 can include growing the first nitride layer 141 by supplying group III element sources including Al and Ga and an N source into the growth chamber under first growth conditions, and growing the second nitride layer 143 by supplying group III element sources including Al and Ga and an N source into the growth chamber under second growth conditions. Furthermore, forming the stress adjustment layer 140 can include forming the Al delta layer 145 using remaining sources having been supplied to grow the first nitride layer 141 during a period of time for which growth conditions are changed from the first growth conditions to the second growth conditions, the Al delta layer 145. As a result, the Al delta layer 145 can have a higher Al composition ratio than the first nitride layer 141. Here, the thickness and the composition ratio of the Al delta layer 145 can be determined by adjusting the first growth condition, the second growth condition, the period of time for which the growth conditions are changed from the first growth conditions to the second growth conditions, and the like.

It should be understood that the present disclosure is not limited thereto, and the Al delta layer 145 can be grown under separate third growth conditions. Under the third growth conditions, the flow rate of the Al source is higher than the flow rate of the Al source under the first and second growth conditions. On the other hand, the structure wherein the Al delta layer 145 is inserted in the first nitride layer 141 can be realized by growing the first nitride layer 141 under the first growth conditions, growing the third nitride layer 145 under the third growth conditions, and growing the first nitride layer 141 again under the first growth conditions.

FIG. 7a and FIG. 7b are sectional views of a UV light emitting diode according to another exemplary embodiment.

Referring to FIG. 7, the UV light emitting diode according to this exemplary embodiment includes a first conductive type semiconductor layer 130, a first stress adjustment layer 140, an active layer 150, a second conductive type semiconductor layer 160, and a second stress adjustment layer 240. The UV light emitting diode according to this exemplary embodiment can further include a growth substrate 110 and a buffer layer 120. As compared with the UV light emitting diode shown in FIG. 1, the UV light emitting diode according to this exemplary embodiment further includes the second stress adjustment layer 240. Hereinafter, the following description will be mainly given of a different feature of the UV light emitting diode according to this exemplary embodiment, and a detailed description of repeated features will be omitted.

The first stress adjustment layer 140 is substantially the same as the stress adjustment layer 140 of FIG. 1, and a detailed description thereof will be omitted.

The second stress adjustment layer 240 is disposed on an upper surface of the buffer layer 120 and under a lower surface of the first conductive type semiconductor layer 130. As compared with a bulk type layer, the second stress adjustment layer 240 can increase compressive stress applied to other layers (for example, the active layer 150) disposed thereon.

The second stress adjustment layer 240 can be composed of a plurality of layers and includes Al delta layers 247 having a relatively high Al composition ratio. The second stress adjustment layer 140 generates compressive stress, thereby relieving increase in tensile stress of the first conductive type semiconductor layer 130 placed on the second stress adjustment layer 140 and allowing average stress of the first conductive type semiconductor layer 130 to become compressive stress. In addition, the second stress adjustment layer 240 can include a plurality of layers, which can include nitride semiconductors having different composition ratios.

Next, referring to FIG. 7b, the second stress adjustment layer 240 according to this exemplary embodiment will be described in detail. FIG. 7b shows an enlarged sectional view of the second stress adjustment layer 240 according to this exemplary embodiment and a graph depicting average stress in each layer.

The second stress adjustment layer 240 can include a stack structure of at least two layers having different Al composition ratios. Particularly, the second stress adjustment layer 240 can include a plurality of layers, the Al composition ratios of which gradually decrease in the upward direction. For example, the second stress adjustment layer 240 can include a first nitride layer 241, a second nitride layer 243, and a third nitride layer 245, in which the first nitride layer 241 can have a higher Al composition ratio than the second nitride layer 243 and the second nitride layer 243 can have a higher Al composition ratio than the third nitride layer 245. Although the second stress adjustment layer 240 includes three nitride layers in this exemplary embodiment, it should be understood that the number of nitride layers is not particularly limited.

In the second stress adjustment layer 240, at least some of the plural layers include the Al delta layers 247. The Al delta layer 247 can be inserted in each of the nitride layers 241, 243, 245. In one of the first to third nitride layers 241, 243, 245, the Al delta layer 247 can be placed to adjoin or substantially contact another layer directly disposed on the layer in which the Al delta layer 247 is placed. Further, the Al delta layer 247 can have a higher Al composition ratio than the nitride layer in which the Al delta layer 247 is inserted and the other nitride layer directly disposed on the Al delta layer 247.

The Al delta layer 247 can include a nitride semiconductor including Al, and in some exemplary embodiments, the Al delta layer 247 can include $Al_zGa_{(1-z)}N$ ($0<z\leq1$). In this formula, z is a composition ratio of Al and can range, for example, from 0.8 to 1. The Al delta layer 145 can have an Al composition ratio of 0.8 or more, thereby further improving a stress adjustment effect through the Al delta layer 247. It should be understood that the present disclosure is not limited to the above Al composition ratio. The Al delta layer 145 can have a thickness of several nanometers. The Al delta layer 247 can have a thickness of several nanometers.

Referring to a graph at the right side of FIG. 7b, reinforcement of the compressive stress factor and decrease in tensile stress by the second stress adjustment layer 240 according to this exemplary embodiment will be described. The graph at the right side of FIG. 7b shows average stress ($\sigma_m$) depending upon a growth direction of the second stress adjustment layer 240. In FIG. 7b, compressive stress and tensile stress do not mean specific values and are provided for comparison of stress factors. Thus, a median value 0 between compressive stress and tensile stress does not mean that stress applied to the corresponding layer is 0, and corresponds to a reference value for comparison of a relative stress factor.

In the graph of FIG. 7b, Line L1 indicates variation of average stress in the structure wherein the second stress adjustment layer 240 is composed of a single layer and Line L2 indicates variation of average stress in the structure wherein the second stress adjustment layer 240 has a multilayer structure. In addition, Line L3 indicates variation in average stress of the second stress adjustment layer 240 including the multilayer structure and the Al delta layer 247.

First, at an interface between the first nitride layer 241 (placed at a lower side) and the Al delta layer 247 (placed at an upper side), tensile stress arises on an upper side of the interface since the first nitride layer 241 has a higher lattice parameter. Then, at an interface between the Al delta layer 247 (placed at a lower side) and the second nitride layer 243 (placed at an upper side), compressive stress arises on an upper side of the interface since the Al delta layer 247 has a lower lattice parameter. Here, since tensile stress gradually increasing in the upward direction is continuously applied to the second stress adjustment layer 240, the magnitude (absolute value) of compressive stress increasing at the upper interface is greater than the magnitude (absolute value) of tensile stress increasing at the lower interface. Accordingly, the second stress adjustment layer 240 including the Al delta layer 247 is subjected to tensile stress gradually decreasing in the upward direction, as compared with the stress adjustment layer not including the Al delta layer 247. Likewise, the compressive stress factor increases at an interface between the second and third nitride layers 243, 245. On the other hand, since the Al delta layer 247 has a very small thickness (several nanometers), cracks do not occur in this region.

On the other hand, the method of forming the second stress adjustment layer 240 is generally similar to the method of forming the first stress adjustment layer 240, and thus a detailed description thereof will be omitted herein.

As such, the UV light emitting diode further includes the second stress adjustment layer 240, thereby further reducing tensile stress applied to the semiconductor layers.

The UV light emitting diode of FIG. 1 can be fabricated to have various structures through additional processes. Hereinafter, the structure of the UV light emitting diode will be described through exemplary embodiments with reference to FIG. 8 to FIG. 10. However, it should be understood that the present disclosure is not limited to the following exemplary embodiments and can be realized in various ways.

First, FIG. 8 is a sectional view of a UV light emitting diode according to another exemplary embodiment.

The UV light emitting diode according to this exemplary embodiment includes a growth substrate 110, a first conductive type semiconductor layer 130, a stress adjustment layer 140, an active layer 150, a second conductive type semiconductor layer 160, a first electrode 171 and a second electrode 173. The UV light emitting diode can further include a buffer layer 120.

The UV light emitting diode of FIG. 8 can be can be fabricated from the UV light emitting diode of FIG. 1. From the UV light emitting diode of FIG. 1, the second conductive type semiconductor layer 160, the active layer 150 and the stress adjustment layer 140 are partially removed such that the first conductive type semiconductor layer 130 is partially removed, and the first and second electrodes 171, 173 are formed on the first conductive type semiconductor layer 130 and the second conductive type semiconductor layer 160, respectively. As a result, a horizontal type UV light emitting diode as shown in FIG. 8 can be provided.

FIG. 9 is a sectional view of a UV light emitting diode according to a further exemplary embodiment.

The UV light emitting diode according to this exemplary embodiment includes a growth substrate 110, a first conductive type semiconductor layer 130, a stress adjustment layer 140, an active layer 150, a second conductive type semiconductor layer 160, a first electrode 181, a second electrode 183, and a submount 185. The UV light emitting diode can further include a buffer layer 120.

The UV light emitting diode of FIG. 9 can be fabricated from the UV light emitting diode of FIG. 1. The first and second electrodes 181, 183 are formed to be electrically connected to the first and second conductive type semiconductor layers 130, 160, respectively, of the UV light emitting diode of FIG. 1, and are connected to the submount 185, thereby providing the UV light emitting diode of FIG. 9. The submount 185 can serve to support the UV light emitting diode and can also act to supply power to the UV light emitting diode. The submount 185 can include an insulation or conductive substrate, for example, a printed circuit board (PCB). As a result, a flip chip type UV light emitting diode as shown in FIG. 9 can be provided.

FIG. 10 is a sectional view of a UV light emitting diode according to yet another exemplary embodiment.

The UV light emitting diode according to this exemplary embodiment includes a first conductive type semiconductor layer 130, a stress adjustment layer 140, an active layer 150, a second conductive type semiconductor layer 160, a first electrode 191, and a support substrate 193.

The support substrate 193 is placed at a lower side of the UV light emitting diode to support semiconductor layers. The support substrate 193 can be an insulation substrate, a conductive substrate, or a circuit board. For example, the support substrate 193 can be a sapphire substrate, a gallium nitride substrate, a glass substrate, a silicon carbide substrate, a silicon substrate, a metal substrate, a ceramic substrate, and the like. In addition, the support substrate 193 can be formed on the second conductive type semiconductor layer 160 via bonding, whereby a bonding layer (not shown) can be further formed between the support substrate 193 and the second conductive type semiconductor layer 160 to bond the support substrate 193 and the second conductive type semiconductor layer 160 to each other.

The bonding layer can include a metallic material, for example, AuSn. The bonding layer including AuSn provides eutectic bonding between the support substrate 193 and the second conductive type semiconductor layer 160. In the structure wherein the support substrate 193 is a conductive substrate, the bonding layer electrically connects the second conductive type semiconductor layer 160 to the support substrate 193.

Furthermore, a reflective layer (not shown) can be further formed between the support substrate 193 and the second conductive type semiconductor layer 160. The reflective layer can include a reflective metal layer (not shown) and a barrier metal layer (not shown), which can be formed to cover the reflective metal layer.

The reflective metal layer can be formed by deposition. The reflective metal layer can serve to reflect light and can act as an electrode electrically connected to the second conductive type semiconductor layer 160. Thus, it is desirable that the reflective metal layer include a material capable of forming ohmic contact while exhibiting high reflectivity with respect to UV light. The reflective metal layer can include at least one metal of, for example, Ni, Mg, Pt, Pd, Rh, W, Ti, Al, Ag and Au. On the other hand, the barrier layer prevents inter-diffusion between the reflective metal layer and other materials. Accordingly, it is possible to prevent increase in contact resistance and decrease in reflectivity due to damage to the reflective metal layer. The barrier layer can include Ni, Cr, Ti, W, Pt, and the like, and can be composed of multiple layers.

Alternatively, a transparent electrode can be further formed between the support substrate 193 and the second conductive type semiconductor layer 160, and can include at least one of conductive oxides such as ITO, IZO and AZO, and a metallic material such as Ni/Au.

The growth substrate 110 can be separated and removed from the first conductive type semiconductor layer 130. Particularly, the growth substrate 110 can be separated from the buffer layer 120.

Separation of the growth substrate 110 from the first conductive type semiconductor layer 130 can be realized by laser lift-off. As shown in FIG. 14, the buffer layer 120 can be decomposed by irradiating the buffer layer 120 with a laser beam (L) in a direction from the growth substrate 110 to the first conductive type semiconductor layer 130, followed by separating the growth substrate 110 from the first conductive type semiconductor layer 130. Here, the growth substrate 110 can be a sapphire substrate and the buffer layer 120 can include GaN or AlGaN. After separation of the growth substrate 110, the buffer layer 120 remaining on the first conductive type semiconductor layer 130 can be removed by a chemical and/or physical method.

According to this exemplary embodiment, the buffer layer 120 including GaN or AlGaN can be interposed between the first conductive type semiconductor layer 130 and the growth substrate 110, thereby allowing easy separation of the growth substrate 110, even using a KrF excimer laser. Accordingly, it is possible to solve difficulty in separation of the growth substrate through laser lift off in fabrication of a typical UV light emitting diode.

Further, the UV light emitting diode, which includes the buffer layer 120 including GaN, has a higher probability of generating cracks in the first conductive type semiconductor layer 130 than a UV light emitting diode including an AlN buffer layer. That is, in the structure wherein a nitride semiconductor layer having a relatively higher composition ratio of Ga is formed between the sapphire substrate and the first conductive type semiconductor layer 130, the probability that cracks occur due to stress applied to the first conductive type semiconductor layer 130 is further increased. Accordingly, conventionally, it is difficult to form the buffer layer 120 including GaN or AlGaN having a relatively high composition ratio of Ga between the growth substrate 110 and the first conductive type semiconductor layer 130 in order to prevent generation of cracks in the first conductive type semiconductor layer 130.

However, according to the exemplary embodiment, since the stress adjustment layer 140 is formed, it is possible to prevent generation of cracks in the first conductive type semiconductor layer 130 even when the buffer layer 120 including GaN or AlGaN having a relatively higher composition ratio of Ga is formed before formation of the first conductive type semiconductor layer 130. Accordingly, a laser lift-off process can be applied to the process of separating the growth substrate 110 in fabrication of a vertical type light emitting diode or a flip-chip type light emitting diode from which the growth substrate 110 is separated. Accordingly, the exemplary embodiments of the present disclosure provide a method of fabricating a UV light emitting diode, which allows easy separation of the growth substrate 110, and a UV light emitting diode fabricated by the same.

However, the present disclosure is not limited thereto, and additional layers (for example, a sacrificial layer) can be further formed between the growth substrate 110 and the semiconductor layers such that the growth substrate 110 can be separated by chemical lift-off, stress lift-off or thermal lift-off. Alternatively, the growth substrate 110 can be removed by a physical/chemical process such as grinding and lapping.

The first electrode 191 can be formed on an upper side of the first conductive type semiconductor layer 130 to be electrically connected to the first conductive type semiconductor layer 130. In some exemplary embodiments, before or after formation of the first electrode 191, a roughness 130R can be further formed on the first conductive type semiconductor layer 130 by increasing surface roughness thereof.

Increasing the surface roughness of the first conductive type semiconductor layer 130 can be performed using dry etching, wet etching, and electrochemical etching, for example, PEC (photo-enhanced chemical) etching, etching using a sulfuric-phosphoric acid solution, or etching using an alkali solution (KOH, NaOH). The roughness varies depending upon etching conditions, and can have an average height of, for example, 1.5 µm or less. The roughness can improve light extraction efficiency of the UV light emitting diode according to the exemplary embodiments.

In other exemplary embodiments, increasing the surface roughness of the first conductive type semiconductor layer 130 can be performed before or after formation of the first electrode 191. In addition, the roughness 130R cannot be formed in a region of the first electrode 191 on the surface of the first conductive type semiconductor layer 130. However, the present disclosure is not limited thereto, and the roughness 130R can be selectively formed in the region of the first electrode 191 by taking into account contact resistance between the first electrode 191 and the first conductive type semiconductor layer 130.

The first electrode 191 can be formed on the first conductive type semiconductor layer 130 by deposition and lift-off, and can be composed of a single layer or multiple layers. The first electrode 191 can include a metal such as Ti, Pt, Au, Cr, Ni, and Al, and can form ohmic contact with the first conductive type semiconductor layer 130.

Although the vertical type light emitting diode having the growth substrate 110 removed therefrom has been described in the above exemplary embodiments with reference to the accompanying drawings, it should be understood that the present disclosure is not limited thereto. The fabrication method according to the exemplary embodiments can also be applied to a flip-chip type light emitting diode from which the growth substrate 110 is removed.

Although some exemplary embodiments have been described herein, it should be understood that these embodiments are given by way of illustration only, and that various modifications, variations and alterations can be made by those skilled in the art without departing from the spirit and scope of the invention.

The invention claimed is:

1. A UV light emitting diode comprising:
a first conductive type semiconductor layer;
a first stress adjustment layer disposed on the first conductive type semiconductor layer, and including a first nitride layer including Al and a second nitride layer disposed on the first nitride layer and having a lower Al composition ratio than the first nitride layer, the first nitride layer having a first surface and a second surface opposite to the first surface;
an active layer disposed on the first stress adjustment layer; and
a second conductive type semiconductor layer disposed on the active layer, wherein the first stress adjustment layer includes an Al delta layer placed in an upper portion of the first nitride layer to contact with the first surface of the first nitride layer, and the second surface of the first nitride layer has greater average tensile stress than a surface of the second nitride layer.

2. The UV light emitting diode of claim 1, wherein the first stress adjustment layer has a multilayer structure by including an additional nitride layer stack formed over the second nitride layer or under the first nitride layer and including an additional first nitride layer and an additional second nitride layer formed over the additional first nitride layer, the Al delta layer has a higher Al composition ratio than the first nitride layer and the additional first nitride layer.

3. The UV light emitting diode of claim 2, wherein the multilayer structure comprises a super lattice structure.

4. The UV light emitting diode of claim 2, wherein the Al delta layer is placed closer to the second nitride layer than the additional second nitride layer.

5. The UV light emitting diode of claim 1, wherein the Al delta layer adjoins the second nitride layer disposed on the first surface of the first nitride layer.

6. The UV light emitting diode of claim 1, wherein the first stress adjustment layer has a multilayer structure by including additional nitride layer stacks, each additional nitride layer stack including an additional first nitride layer and an additional second nitride layer formed over the additional first nitride layer, and wherein the first stress adjustment layer includes additional Al delta layers placed in upper portions of some of the additional first nitride layers, and the Al delta layer and the additional Al delta layers are arranged at a regular interval across the first stress adjustment layer.

7. The UV light emitting diode of claim 1, wherein the first stress adjustment layer has a multilayer structure by including additional nitride layer stacks, each additional nitride layer stack including an additional first nitride layer and an additional second nitride layer formed over the additional first nitride layer, and wherein the first stress adjustment layer includes additional Al delta layer placed in upper portions of some of the additional first nitride layers, and the Al delta layer and the additional Al delta layers are arranged at an irregular intervals across the first stress adjustment layer.

8. The UV light emitting diode of claim 1, wherein the first stress adjustment layer has a multilayer structure by including additional nitride layer stacks, each additional nitride layer stack including an additional first nitride layer and an additional second nitride layer formed over the additional first nitride layer, and wherein the first stress adjustment layer includes additional Al delta layers placed in some of the first nitride layers, and distances between two of the Al delta layer and the additional Al delta layers gradually decrease in a direction toward the active layer.

9. The UV light emitting diode of claim 1, wherein the Al delta layer has a gradually increasing Al composition ratio in a direction from the first conductive type semiconductor layer to the active layer.

10. The UV light emitting diode of claim 1, wherein the first nitride layer includes $Al_xGa_{(1-x)}N$ (0<x<1), the second nitride layer includes $Al_yGa_{(1-y)}N$ (0<y<1), and the Al delta layer includes $Al_zGa_{(1-z)}N$ (0<z≤1, y<x<z).

11. The UV light emitting diode of claim 10, wherein the Al delta layer includes $Al_zGa_{(1-z)}N$ (0.8≤z≤1).

12. The UV light emitting diode of claim 1, further including:

a first electrode disposed under the first conductive type semiconductor layer; and a second electrode disposed on the second conductive type semiconductor layer.

13. The UV light emitting diode of claim 1, further including:
a growth substrate disposed under the first conductive type semiconductor layer,
wherein the growth substrate has a higher coefficient of thermal expansion than the first conductive type semiconductor layer.

14. The UV light emitting diode of claim 1, wherein each of the first and second nitride layers has a thickness of 5 nm to 30 nm.

15. The UV light emitting diode of claim 1, wherein the active layer emits light having a peak wavelength of 270 nm to 315 nm.

16. The UV light emitting diode of claim 1, further including:
a second stress adjustment layer disposed under the first conductive type semiconductor layer and including a plurality of nitride layers,
wherein the second stress adjustment layer includes an Al delta layer placed in at least one nitride layer among the plurality of nitride layers, the Al delta layer having a higher Al composition ratio than any nitride layer in which the Al delta layer is placed.

17. The UV light emitting diode of claim 16, wherein each of the plurality of nitride layers of the second stress adjustment layer has a gradually decreasing Al composition ratio in a direction toward the first conductive type semiconductor layer.

18. The UV light emitting diode of claim 1, wherein each of the first and second nitride layers has increasing average tensile stress in a direction from the first conductive type semiconductor layer to the active layer, and an average tensile stress increase rate in the first nitride layer is greater than the average tensile stress increase rate in the second nitride layer in the direction from the first conductive type semiconductor layer to the active layer.

19. A UV light emitting diode comprising:
a first conductive type semiconductor layer;
a stress adjustment layer disposed on the first conductive type semiconductor layer and having layers including a first layer and a second layer disposed over the first layer and an Al delta layer placed in at least one of the layers;
an active layer disposed on the stress adjustment layer; and
a second conductive type semiconductor layer disposed on the active layer,
wherein a lattice parameter of the Al delta layer is less than an average lattice parameter of the stress adjustment layer, and the stress adjustment layer operates to apply greater compressive stress to at least one of the active layer and the second conductive type semiconductor layer than that applied to a single layer having the same composition ratio as an average composition ratio of the stress adjustment layer.

20. A method of fabricating a UV light emitting diode comprising:
forming a first conductive type semiconductor layer on a growth substrate;
forming a first stress adjustment layer on the first conductive type semiconductor layer, the first stress adjustment layer including a first nitride layer including Al and a second nitride layer disposed on the first nitride layer and having a lower Al composition ratio than the first nitride layer;
forming an active layer on the first stress adjustment layer; and
forming a second conductive type semiconductor layer on the active layer,
wherein the forming the first stress adjustment layer includes inserting an Al delta layer in the first nitride layer, and a lower surface of the first nitride layer has greater average tensile stress than a lower surface of the second nitride layer.

21. The method of fabricating a UV light emitting diode of claim 20, wherein the forming the first stress adjustment layer further includes growing the first nitride layer under first growth conditions, growing the second nitride layer under second growth conditions, and growing the Al delta layer during a period of time for which growth conditions are changed from the first growth conditions to the second growth conditions.

22. The method of fabricating a UV light emitting diode of claim 20, wherein the forming the first stress adjustment layer includes growing the first nitride layer under first growth conditions, growing the Al delta layer under third growth conditions, and growing the second nitride layer on the first nitride layer under second growth conditions, the first to third growth conditions different from one another.

23. The method of fabricating a UV light emitting diode of claim 22, wherein the inserting of the Al delta layer into the first nitride layer is performed during the growth of the first nitride layer.

24. The method of fabricating a UV light emitting diode of claim 20, wherein the forming the stress adjustment layer includes stacking additional first nitride layers and additional second nitride layers, and inserting an additional Al delta layer in at least one of the additional first nitride layers.

25. The method of fabricating a UV light emitting diode of claim 24, wherein the stacking of the additional first nitride layers and the additional second nitride layers allows the first stress adjustment layer to have a super lattice structure.

26. The method of fabricating a UV light emitting diode of claim 20, wherein the Al delta layer adjoins the second nitride layer.

27. The method of fabricating a UV light emitting diode of claim 20, further including: before forming of the first conductive type semiconductor layer, forming a second stress adjustment layer on the growth substrate, the second stress adjustment layer including a plurality of nitride layers,
wherein the forming of the second stress adjustment layer includes forming an Al delta layer inserted in at least one of the plurality of nitride layers.

* * * * *